United States Patent [19]
Kubinec

[11] Patent Number: 4,894,626
[45] Date of Patent: Jan. 16, 1990

[54] VARIABLE LENGTH SHIFT REGISTER

[75] Inventor: James J. Kubinec, Incline Village, Nev.

[73] Assignee: Advanced Micro Devices, Inc., Sunnyvale, Calif.

[21] Appl. No.: 251,724

[22] Filed: Sep. 30, 1988

[51] Int. Cl.$^4$ .................. H03K 5/14; H03K 5/139
[52] U.S. Cl. ................................ 333/101; 333/139; 328/55; 307/602; 307/603; 377/76
[58] Field of Search ............... 377/70, 75, 76; 307/595, 596, 602, 603, 597; 333/139, 144, 101; 328/55, 56

[56] References Cited

U.S. PATENT DOCUMENTS

| | | | |
|---|---|---|---|
| 3,577,087 | 5/1971 | Kliman | 377/76 |
| 4,626,716 | 12/1986 | Miki | 307/602 |
| 4,677,499 | 6/1987 | Shirota et al. | 307/602 |
| 4,682,128 | 7/1987 | Sproul et al. | 333/101 |

Primary Examiner—John S. Heyman
Attorney, Agent, or Firm—Skjerven, Morrill, MacPherson, Franklin & Friel

[57] ABSTRACT

A programmable computer shift register or other time delay means of variable length that provides time delays that are integral multiples of a predetermined time delay unit $\Delta t$, that uses relatively few switches, that controls time delays introduced by passage of signals through multiple-state switches that are in different states.

7 Claims, 2 Drawing Sheets

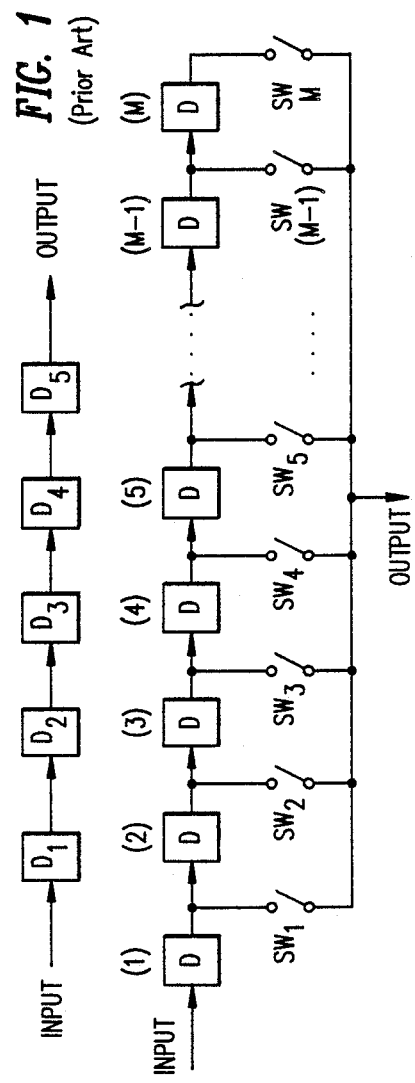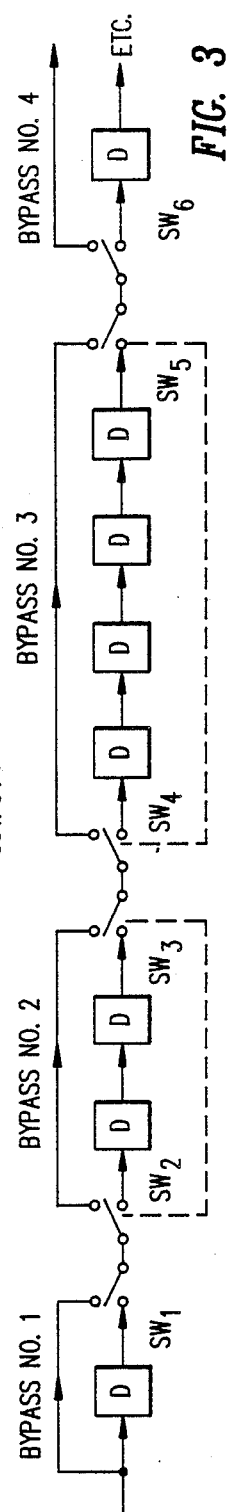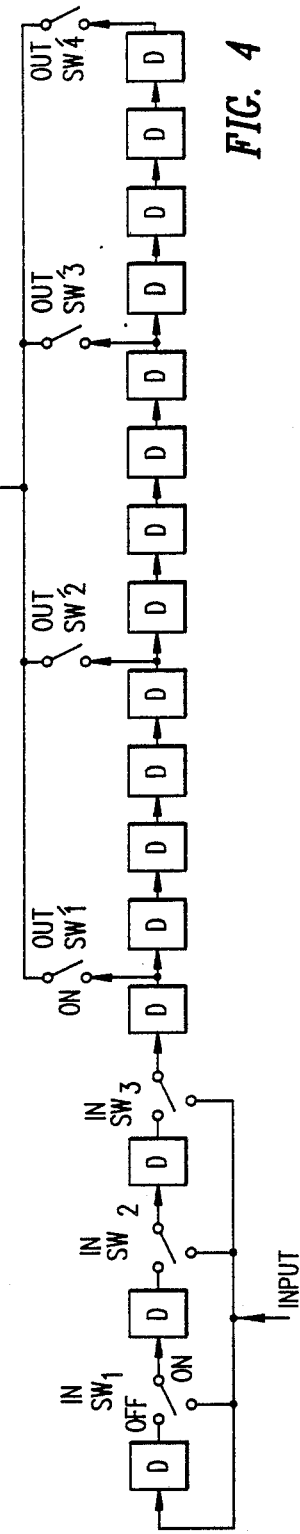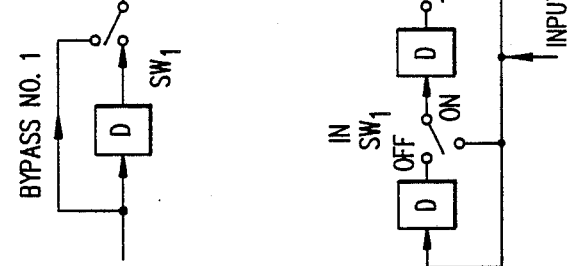

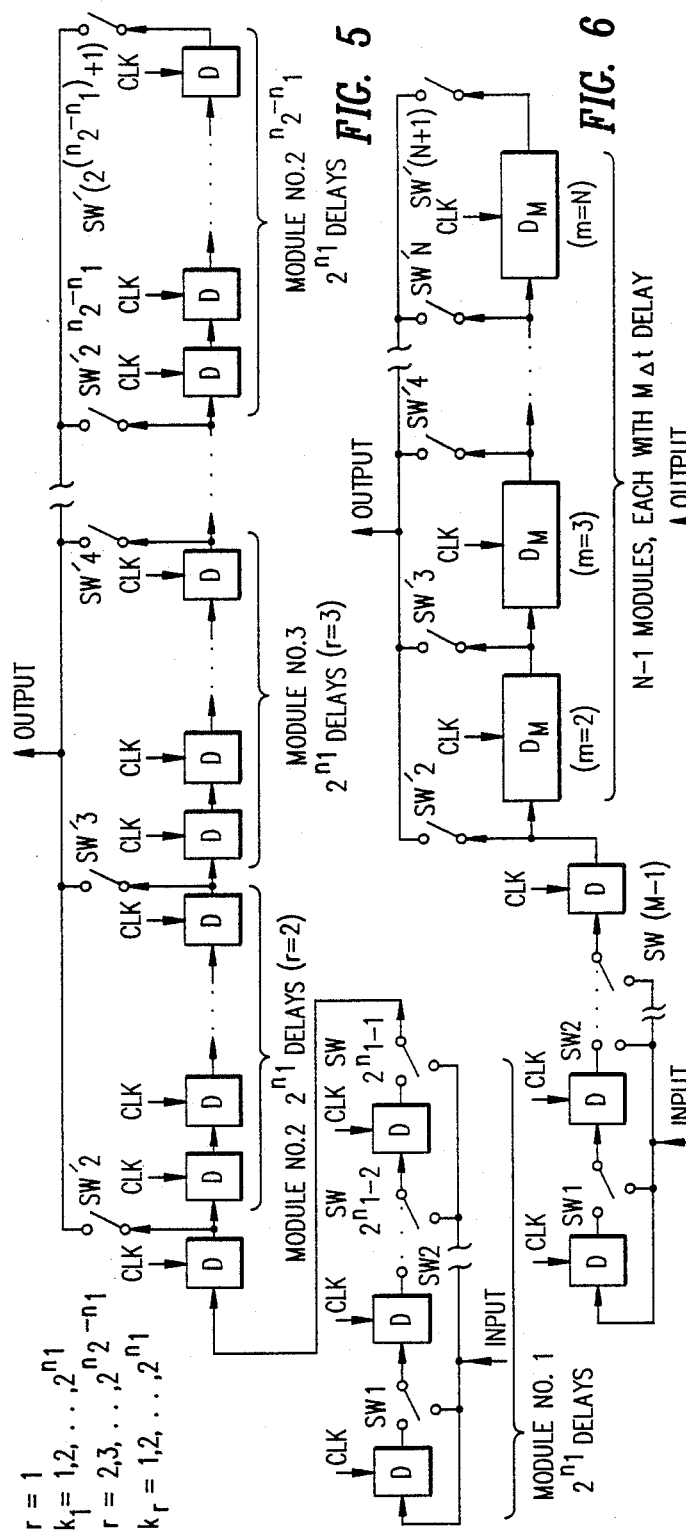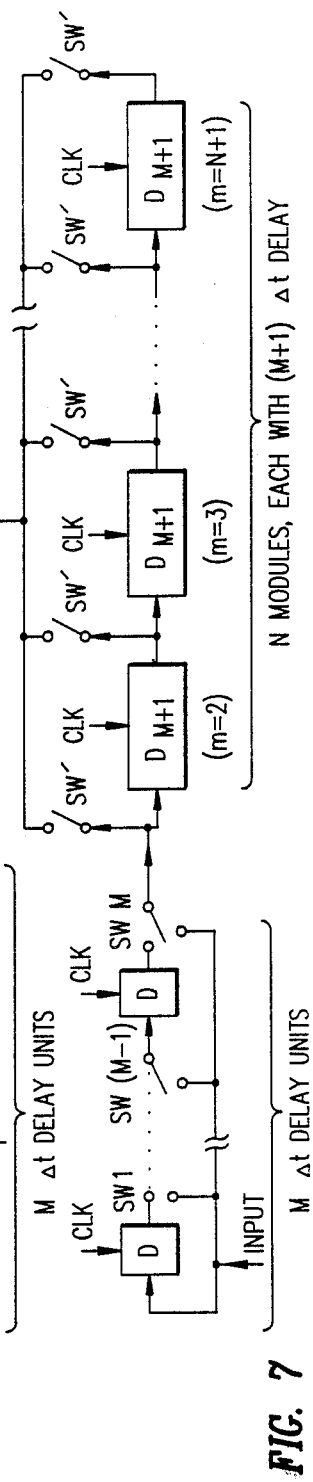

VARIABLE LENGTH SHIFT REGISTER

FIELD OF THE INVENTION

This invention relates to computer shift registers whose length is variable.

BACKGROUND OF THE INVENTION

Time delay elements or shift registers are easily fabricated in integrated circuit technology. An input signal, delivered to the input terminal of a shift register, will not appear at the output terminal of the shift register until one cycle of the applicable clock has occurred. If one strings together a series of n such shift register modules, as illustrated in FIG. 1 where n=5, a signal, delivered to the input terminal of a first register $D_1$ will appear n clock cycles later at the output terminal of register $D_n$. Substantially all of the shift registers or delay lines built and offered for sale by various manufacturers have a fixed length or time delay, usually ranging from a time delay of as low as eight time units to as high as many thousands of time units.

A shift register or delay line that has a programmable length that varies over a sequence of times $n\Delta t$, wherein equals 1,2, . . . ,N, would be a useful component in the design of general purpose and special purpose computers. FIG. 2 illustrates one straightforward approach to provision of such a switch register. If switch SW1 is closed and all other switches are open, the output signal will be delayed one time unit $\Delta t$ relative to the input signal. If switch SW5 is closed and all other switches are open, the output signal will be delayed by a time $5\Delta t$ relative to the input signal, for example.

This variable delay shift register is straightforward and easy to understand, but it carries with it certain problems. First, for a shift register of maximum length N, where N is a positive integer, N switches are needed to implement this shift register. This introduces a significant amount of additional circuitry and logic to select which switch is to be closed. Second, the output signal from each time delay element or shift register module must be routed to two places; to the input of the next time delay element, which is easy to do, and to the switch matrix, which may be much more difficult. This carries with it a chip area penalty and forces a substantial increase in cost for such a shift register vis-a-vis a standard, fixed length shift register. Third, the output terminal is connected to N switches. Although only one of these switches is in the "on" position, the remaining N-1 "off" switches represent a significant parasitic load that would limit the performance of such a shift register. One example of this approach is disclosed in U.S. Pat. No. 4,330,750, issued to Mayor for "Variable Delay Circuits."

FIG. 3 illustrates another approach to a variable length shift register from the prior art that allows time delays from $\Delta t$ to $32\Delta t$ in integral multiples of the unit $\Delta t$. For example, with (only) switches SW1, SW2, SW3, SW4 and SW5 activated so that bypasses 1, 2 and 3 are not used but the remaining bypasses are used, the total delay would be $\Delta t + 2\Delta t + 4\Delta t = 7\Delta t$. As another example, if switches SW2, SW3, SW6 and SW7 are activated so that bypasses number 2 and number 4 are not used, the corresponding time delay is $2\Delta t + 8\Delta t = 10\Delta t$. All combinations of times from $\Delta t$ to $32\Delta t$ may be implemented using the prior art device shown in FIG. 3. For a maximum time delay of $M=2^K$ time units $\Delta t$, (K=1,2,3, . . . ) precisely 2K switches are needed; K=5 in the example shown in FIG. 3. Where a combination of time delays up to $1024\Delta t = 2^{10}\Delta t$, twenty switches would be required. The device shown in FIG. 3 offers a more compact implementation of a variable length shift register, using a reduced number of switches. A configuration incorporating the technique of FIG. 3 is disclosed in U.S. Pat. No. 4,016,511, issued to Ramsey and Post for a "Programmable Variable Length High Speed Digital Delay Line."

However, certain disadvantages are evident from the configuration illustrated in FIG. 3. First, the individual switches are more complex because, for example, switches SW2 and SW3 must work in unison. Second, implementation of the switches will cause each switch to have its own characteristic time delay, and the time delay (for passage through the switch itself) may be different for a switch in the activated or in the inactivated state. This will introduce variable incremental time delay (a fraction of $\Delta t$) on top of the variable time delay sought by use of the apparatus shown in FIG. 3. Third, if the length of the shift register is changed during operation of the device ("on the fly"), it is a matter of some complexity to determine the number of clock cycles required before the device has cleared itself for subsequent operation.

An interesting variation on this general approach is disclosed by U.S. Pat. No. 4,530,107, issued to Williams for a "Shift Register Delay Circuit," wherein one set of registers is used to determine coarse time delay (integral time units) and a second set of registers is used to determine fine time delay (fractions of a time unit).

SUMMARY OF THE INVENTION

The invention provides a variable length shift register for time delay of signals that uses a reduced number of switches and does not require coordination of the states of two or more switches.

Other objects of the invention and advantages thereof will become clear by reference to the detailed description and the accompanying drawings.

The objects of this invention may be realized in accordance with the invention in one embodiment by:

a first time delay means having an input terminal, a clock input terminal, an output terminal and having a first plurality of programmable switch means, for producing a time delay of any of the lengths $\Delta t$, $2\Delta t$, $3\Delta t$, . . . , $M\Delta t$, where M is a predetermined positive integer, by programming of the first plurality of programmable switch means, where each of the programmable switch means has a first state and a second state and where the signal to be time delayed is received at the input terminal of the first time delay means;

a second time delay means having an input terminal, a clock input terminal, an output terminal and a second plurality of programmable switch means, for producing a time delay of any of the lengths 0, $M\Delta t$, $2M\Delta t$, . . . , $(N-1)M\Delta t$, where N is a predetermined positive integer, where each programmable switch means has a first state and a second state, where the input terminal of the second time delay means is connected to the output terminal of the first time delay means, where the time delayed signal is issued at the output terminal of the second time delay means, and where precisely one of the first plurality of programmable switch means and one of the second plurality of programmable switch means is in the first state for any operation of the apparatus; and a source of periodic clock pulses having a clock cycle of length substantially $\Delta t$ that is connected to the clock input terminal of each of the first time delay means and the second time delay means.

The objects of this invention may be realized in accordance with this invention in a second embodiment by:

a first time delay means having an input terminal, a clock input terminal, an output terminal and a first plurality of programmable switch means, for producing a time delay of any of the lengths 0, $\Delta t$, $2\Delta t$, ..., $M\Delta t$ by programming of the first plurality of programmable switch means, where each programmable switch means has a first state and a second state and where the signal that is to be time delayed is received at the input terminal;

a second time delay means having an input terminal, a clock input terminal, an output terminal and a second plurality of programmable switch means, for producing time delays of any of the lengths $(M+1)\Delta t$, $2(M+1)\Delta t$, ..., $N(M+1)\Delta t$ by programming of the second plurality of programmable switch means, with each programmable switch means having a first state and a second state, where the input terminal of the second time delay means is connected to the output terminal of the first time delay means, where the signal that is to be time delayed issues from the output terminal of the second time delay means, and where at most one programmable switch means from the first plurality and precisely one programmable switch means from the second plurality is programmed to be in the first state for any operation of the apparatus; and a source of periodic clock pulses having a clock cycle of length substantially of $\Delta t$ that is connected to the clock input terminals of the first time delay means and the second time delay means.

BRIEF DESCRIPTION OF THE DRAWINGS

FIG. 1 is a schematic view of a fixed length shift register or time delay element.

FIGS. 2 and 3 are schematic views of prior art devices that provide variable length shift registers.

FIG. 4 is a schematic view of one embodiment of a variable length shift register according to the invention that provides maximum time delay $16\Delta t$.

FIG. 5 is a schematic view of the embodiment of FIG. 4 that provides a maximum time delay of $2^{n_2}\Delta t$, where $n_2$ is a positive integer $\geq 2$.

FIG. 6 is a schematic view of an embodiment of the invention that provides a maximum time delay of $M(N+1)\Delta t$, where M and N are positive integers.

FIG. 7 is a schematic view of an embodiment of the invention that provides time delays 0, $\Delta t$, $2\Delta t$, ..., $[(M+1)(N+1)-1]\Delta t$, where M and N are positive integers.

FIG. 8 corresponds to FIG. 6, with an additional two-state switch included adjacent to the input terminal.

DETAILED DESCRIPTION

FIG. 4 illustrates one embodiment of the invention, wherein a shift register of variable length $\Delta t$, $2\Delta t$, $3\Delta t$ ..., $16\Delta t$ is provided using seven two-state switches that are not coordinated with one another, as would be required in the device shown in FIG. 3. For example, if one desires a time delay of $1166 t$, switch SW1 would be set in the "on" position, switches SW2 and SW3 would be set in the "off" position, switches SW'1, SW'2 and SW'4 would be set in the "off" position and switch SW'3 would be set in the "on" position to produce a total time delay of $\Delta t + \Delta t + \Delta t + 4\Delta t + 4\Delta t = 11\Delta t$ as desired.

In a more general approach using this embodiment, one would provide a first module having a linear array of $2^{n_1}$ time delay units connected together, each of which introduces a time delay $\Delta t$; and one would provide $2^{(n_2-n_1)}-1$ additional modules, with each such module having a linear array of $2^{n_1}$ time delay units connected together therein. The entire configuration would then provide variable length time delays $\Delta t$, $2\Delta t$, $3\Delta t$, ..., $2^{n_2}\Delta t$, as illustrated in FIG. 5. The configuration shown in FIG. 5 requires $2^{(n_2-n_1)}+2$ two-state switches and $2^{n_2}$ time delay units to implement this shift register. For the particular configuration shown in FIG. 4, $n_2=4$, $n_1=2$ and seven switches are required. In order to minimize the total number of switches needed, one would choose $n_1 = n_2/2$ or $(n_2 \pm 1)/2$ according as $n_2$ is an even integer or an odd integer. In the embodiment shown generally in FIG. 5 one has: (1) $2^{n_1}$ first input positions, each being separated by one time unit ($\Delta t$) of delay; and (2) $2^{(n_2-n_1)}-1$ second input positions, each being separated by $2^{n_1}$ units of time delay.

The general embodiment shown in FIG. 5 uses a linear array of $2^{n_2}$ individual time delay units D, where $n_2$ is an integer greater than or equal to 2. A first module, comprises $2^{n_1}$ time delay units D, numbered $k_1 = 1, 2, 3, \ldots, 2^{n_1}$ and arranged linearly so that the output terminal of unit $k_1$ is adjacent to the input terminal of delay unit $k_1 + 1$ for $k_1 = 1, 2, \ldots, 2^{n_1} - 1$. A two-state switch SW $k_1$ connects the input terminal of delay unit $k_1 + 1$ to either the output terminal of delay unit $k_1$ (the "off" state) or to the input terminal of the apparatus (the "on" state) for $k_1 = 1, 2, \ldots, 2^{n_1} - 1$. The input terminal of time delay unit $k_1 = 1$ is directly connected to the input terminal of the apparatus. The remaining time delay units in the apparatus are arranged in modules numbered $r = 2, 3, \ldots, 2^{(n_2-n_1)}$, each module having a linear array of $2^{n_1}$ time delay units D, where the individual time delay units for module r are numbered $k_r = 1, 2, \ldots, 2^{n_1}$ for convenient reference. Within module $r = 2, 3, \ldots, 2^{(n_2-n_1)}$, the output terminal of time delay unit no. $k_r$ is connected to the input terminal of time delay unit no. $k_r + 1$ for $k_r = 1, 2, \ldots, 2^{(n_2-n_1)} - 1$; and the terminal of time delay unit no. $k_r = 2^{n_1}$ of module $r = 2, 3, \ldots, 2^{(n_2-n_1)} - 1$ is connected to the input terminal of time delay unit no. $k_{r+1} = 1$ of module $r+1$. The output terminal of time delay unit no. $k_r = 2^{n_1}$ of module $r = 2, 3, \ldots, 2^{(n_2-n_1)}$ is connected to the output terminal of the apparatus by a two-state switch SW'$(r+1)$; a first state of the switch provides a direct connection of the input terminal of that time delay unit to the apparatus output terminal; and a second state of the switch breaks or disrupts this direct connection so that no signal can flow directly from the said input terminal to the apparatus output terminal. A switch SW'2 that is substantially identical to the other switches SW' connects the input terminal of time delay unit $k_r = 1$ in the second module ($r = 2$) to the output terminal of the apparatus. Finally, each time delay unit D receives a clock signal at its clock input terminal. The embodiment shown in FIG. 5 can provide time delay of a signal entering the apparatus input terminal by amounts $\Delta t, 2\Delta t, 3\Delta t, \ldots, 2^{n2}\Delta t$, if the cycle of the clock signal has length $\Delta t$. The total number of switches required, $2^{(n2-n1)}+2^{n1}$, is minimized with the choice $n_1 \approx n_2$.

The embodiment shown generally in FIG. 5 provides a variable length shift register with reduced requirements for the number of switches so that both chip size and cost are lowered correspondingly. Second, for any length $\Delta t, 2\Delta t, \ldots, 2^{n2}\Delta t$, one or at most two switches are in the "on" position between the input terminal and the output terminal, one in module no. 1 and one in the collection of other modules. This produces a uniform time delay due to passage through the switch element itself. Third, the state of the shift register is easily determined and is predictable when the shift register length is changed from one value to another.

Another general embodiment is shown in FIG. 6 and comprises a linear arrangement of M individual time delay units D (numbered 1, 2, ..., M), each with associated time delay $\Delta t$, together with $N-1$ time delay modules $D_M$ (numbered 2, 3, ..., N), each with associated time delay $M\Delta t$. The individual time delay units D and time delay modules $D_M$ each have an input terminal, a clock input terminal and an output terminal. With reference to the individual time delay units D, a two-state switch SWk similar to the switches SW in FIG. 5 connects the input terminal of delay unit $k+1$ to either the input terminal of the apparatus (the "on" or first state) or to the output terminal of individual time delay unit k (the "off" or second state) for $k=1,2,\ldots,M-1$. The input terminal of time delay unit (D) number $k=1$ is directly connected to the input terminal of the apparatus. With reference to the time delay modules $D_M$, the output terminal of module $m=2,3,\ldots,N$ is connected to the output terminal of the apparatus by a two-state switch SW'm that provides a direct connection to the apparatus output terminal in one position (first state) and provides a broken or disrupted connection in a second state; a similar switch SW'1 connects the output terminal of individual time delay unit (D) number $k=M$ to the apparatus output terminal. Individual time delay unit (D) number $k=M$ is directly connected to the input terminal of time delay module ($D_M$) number $m=2$, and the output terminal of time delay module m is directly connected to the input terminal of time delay module $m+1$ for $m=2, 3, \ldots, N-1$. The individual time delay units D and the time delay modules $D_M$ all receive a clock signal from a clock source CLK at their respective clock input terminals. The embodiments shown in FIGS. 5 and 6 may be realized more generally by a first module with first programmable switch means that produces a time delay of $\Delta t, 2\Delta t, 3\Delta t, \ldots, M\Delta t$, connected to a second module with second programmable switch means that produces a time delay of $0, M\Delta t, 2M\Delta t, 3M\Delta t, \ldots, (N-1)M\Delta t$, where M and N are predetermined positive integers with $N \geq 2$ and precisely one switch in each of the first and second programmable switch means is in the "on" position for any choice of total time delay $\Delta t, 2\Delta t, 3\Delta t, \ldots, MN\Delta t$. The embodiment shown in FIG. 6 can introduce a delay of $\Delta t, 2\Delta t, 3\Delta t, \ldots, NM\Delta t$ by appropriate setting of the switches SW and SW', if the cycle of the clock signal has length $\Delta t$. Again, the signal that enters the input terminal of the apparatus passes through one or at most two switches in the "on" or first state before this signal, now time delayed, passes through the output terminal of the apparatus. With the embodiment illustrated in FIG. 6, the total number of switches $M+N$ required is minimized for $M \approx N$.

FIG. 7 illustrates another embodiment of the invention, using M individual time delay units D that are connected together as in FIGS. 5 and 6 and using N time delay modules $D_{M+1}$, each with associated time delay $(M+1)\Delta t$, which are connected together as are the time delay modules $D_M$ in FIG. 6. In FIG. 7, the input terminal of the first time delay module $D_{M+1}$ is associated with individual time delay unit D number M through a two-state switch SWM; where in a first state of the switch the input terminal of the apparatus is directly connected to the input terminal of the time delay module $D_{M+1}$ number $m=2$; and in a second state of this switch the output terminal of individual time delay unit M is directly connected to the input terminal of the time delay module $D_{M+1}$ number $m=2$. Using the configuration shown in FIG. 7, a time delay of $0, \Delta t, 2\Delta t, \ldots, [(M+1)(N+1)-1]\Delta t$ is obtained by suitable programming of the switches. Again, the number of switches is minimized if M and N are chosen to be substantially equal.

In order to assure that the output signal of the overall apparatus has passed through precisely two switches in the "on" position or first state in each of FIGS. 5, 6 and 7, another two-state switch might be inserted between the input terminal of the apparatus and the input terminal of the first of the individual time delay units D in those Figures. By way of example, FIG. 9 illustrates the change in the embodiment of FIG. 6 with this additional two-state switch SWO included between the input terminal of the apparatus and the input terminal of the first time delay unit D; in the second state, of the switch SWO, the connection between these two input terminals is disrupted or broken.

Although the preferred embodiment of the invention has been shown and described herein, variation and modification may be made without departing from the scope of the invention.

I claim:

1. Apparatus for providing variable length time delays of $\Delta t, 2\Delta t, 3\Delta t, \ldots, MN\Delta t$, where $\Delta t$ is a predetermined time interval and M and N are predetermined positive integers with $N \geq 2$, the apparatus comprising:

first time delay means, having an input terminal, a clock input terminal, an output terminal and a first plurality of programmable switch means, with each switch means having a first state and a second state, for producing a time delay of any of the lengths $\Delta t, 2\Delta t, 3\Delta t, \ldots, M\Delta t$ by programming of the first plurality of programmable switch means, with the input terminal of the first time delay means receiving the signal that is to be delayed in time; and second time delay means, having an input terminal connected to the output terminal of the first time delay means, a clock input terminal, and output terminal and a second plurality of programmable switch means, with each switch means having a first state and a second state, for producing a time delay of any of the lengths $0, M\Delta t, 2M\Delta t, \ldots, (N-1) M\Delta t$ at the output terminal of the second time delay means, where at most one programmable switch means from the first time delay means and precisely one programmable switch means from the second time delay means is programmed to be in a first state for any operation of the apparatus; and a source of periodic clock pulses having a clock cycle of length substantially $\Delta t$ that is connected to the clock input terminal of each of the first time delay means and the second time delay means.

2. Apparatus according to claim 1 wherein said integer M is substantially equal to said integer N.

3. Apparatus for providing variable length time delays of $\Delta t, 2\Delta t, 3\Delta t, \ldots, MN\Delta t$, where $\Delta t$ is a predetermined time interval and M and N are predetermined positive integers, the apparatus having an input terminal and an output terminal and comprising:

a first time delay module comprising M time delay units, with each unit providing a time delay of substantially $\Delta t$ and having an input terminal, a clock input terminal and an output terminal, with the input terminal thereof receiving and storing an input signal within the time delay unit when the clock input terminal receives a first clock input signal, and with the output terminal of the time delay unit issuing an output signal that is the input signal stored therein when the clock input terminal receives a second clock input signal, with the time delay units of module 1 being consecutively numbered $k_1 = 1, 2, \ldots, M$;

a first plurality of $M-1$ two-state switches, numbered consecutively $j = 1, 2, \ldots, M-1$ where time delay unit number $k_1 - 1$ ($k_1 = 2, 3, \ldots, M$) of the first module is associated with time delay unit number $k_1$ through switch number $j = k_1 - 1$, with the first switch state being a direct electrical connection of the input terminal of time delay unit $k_1$ to the input terminal of the apparatus, and with the second switch state being a direct electrical connection of the output terminal of time delay unit number $k_1 - 1$ to the input terminal of time delay unit number $k_1$, where the input terminal of the apparatus is directly connected to the input terminal of the first time delay unit number $k_1 = 1$;

$N - 1$ time delay modules, with each module providing a time delay $M\Delta t$ and having an input terminal, a clock input terminal and an output terminal, with these modules being numbered consecutively $m = 2, \ldots, N$, with the output terminal of module m being directly connected to the input terminal of module $m + 1$, for $m = 2, \ldots, N - 1$, and with the input terminal of module $m = 2$ being connected to the output terminal of time delay unit number $k_1 = M$ of the first module;

a second plurality of N two-state switches numbered consecutively $n = 1, 2, 3, \ldots, N$, here switch number n ($n \geq 2$) is connected between the output terminal of module n and the output terminal of the apparatus for $n = 2, 3, \ldots, N$ and switch number $n = 1$ is connected between the output terminal of time delay unit number $k_1 = M$ of the first module and the output terminal of the apparatus, where a first state of a two-state switch directly connects an output terminal of a module to the output terminal of the apparatus and where, in a second state of the two-state switch, this direct connection is broken or disrupted; and a source of periodic clock pulses having a clock cycle of length substantially $\Delta t$ that is connected to the clock input terminals of each of the time delay units and to the clock input terminals of each of the time delay modules.

4. Apparatus according to Claim 3, wherein said integer M is substantially equal to said integer N.

5. Apparatus for providing variable length time delays of $0, \Delta t, 2\Delta t, 3\Delta t, \ldots, [(N+1)(M+1)-1]\Delta t$ where $\Delta t$ is a predetermined time interval and M and N are predetermined positive integers, the apparatus comprising:

a first time delay means having an input terminal, a clock input terminal, an output terminal and a first plurality of programmable switch means, for producing a time delay of any of the lengths $0, \Delta t, 2\Delta t, \ldots, M\Delta t$ by programming of the first plurality of programmable switch means, where each programmable switch means has a first state and a second state and where the signal that is to be time delayed is received at the input terminal;

a second time delay means having an input terminal connected to the output terminal of the first time delay means, a clock input terminal, an output terminal and a second plurality of programmable switch means, for producing time delays of any of the lengths $(M+1)\Delta t, 2(M+1)\Delta t, \ldots, N(M+1)\Delta t$ by programming of the second plurality of programmable switch means, with each programmable switch means having a first state and a second state, where the input terminal of the second time delay means is connected to the output terminal of the first time delay means, where the signal that is to be time delayed issues from the output terminal of the second time delay means, and where at most one programmable switch means from the first plurality and precisely one programmable switch means from the second plurality is programmed to be in the first state for any operation of the apparatus; and a source of periodic clock pulses having a clock cycle of length substantially of $\Delta t$ that is connected to the clock input terminals of the first time delay means and the second time delay means.

6. Apparatus according to claim 5, wherein said integer M is substantially equal to said integer N.

7. Apparatus for providing variable length time delays of $0, \Delta t, 2\Delta t, 3\Delta t, \ldots, [(N+1)f M+1)-1]\Delta t$, where $\Delta t$ is a predetermined time interval and M and N are predetermined positive integers, the apparatus having an input terminal and an output terminal and comprising:

a first time delay module comprising M time delay units, each unit providing a time delay of substantially $M\Delta t$ and having an input terminal, a clock input terminal and an output terminal, with the input terminal thereof receiving and storing an input signal within the time delay unit when the clock input terminal receives a first clock input signal and with the output terminal of the time delay unit issuing an output signal that is the input signal stored therein when the clock input terminal receives a second clock input signal, with the time delay units of module 1 being numbered consecutively $k_1 = 1, 2, \ldots, M$;

a first plurality of M two-state switches, numbered consecutively $j = 1, 2, \ldots, M$, where time delay unit number $k_1 - 1$ of the first module is associated with time delay unit number $k_1$ through switch number $j = k_1 - 1$ ($k_1 = 2, 3, \ldots, M$), with the first switch state being a direct electrical connection of the input terminal of time delay unit $k_1$ to the input terminal of the apparatus, and with the second switch state being a direct electrical connection of the output terminal of time delay unit $k_1 - 1$ to the input terminal of time delay unit $k_1$, where the input terminal of the apparatus is directly connected to the input terminal of the first time delay unit number $k_1 = 1$;

N time delay modules, with each module providing a time delay $(M+1)\Delta t$ and having an input terminal, a clock input terminal and an output terminal, these modules being numbered consecutively $m = 2, 3, \ldots, N, N+1$, with the output terminal of module m being directly connected to the input terminal of module $m+1$ for $m = 2, 3, \ldots, N-1, N$, where the input terminal of module $m = 2$ is associated with the output terminal of time delay unit number $k_1 = M$ of the first module by switch number $j = M$ from the first plurality of switches, with a first state of this switch being a direct connection of the input terminal of the second module to the input terminal of the apparatus and a second state of this switch being a direct electrical connection of the input terminal of the second module to the output terminal of time delay unit number $k_1 = M$ of the first module;

a second plurality of $N+1$ two-state switches, numbered consecutively $n = 1, 2, 3, \ldots, N+1$, where switch number n is connected between the output terminal of module n and the output terminal of the apparatus for $n = 2, 3, \ldots, N+1$ and switch $n = 1$ is connected between the output terminal of time delay unit $k_1 = M$ of the first module and the output terminal of the apparatus, where the first state of a two-state switch directly connects an output terminal of a module to the output terminal of the apparatus and where, in a second state of the two-state switch, this direct connection is broken or disrupted; and a source of periodic clock pulses having a clock cycle of length substantially $\Delta t$ that is connected to the clock input terminals of each of the time delay units and to the clock input terminals of each of the time delay modules.

* * * * *

UNITED STATES PATENT AND TRADEMARK OFFICE
CERTIFICATE OF CORRECTION

PATENT NO. : 4,894,626
DATED : January 16, 1990
INVENTOR(S) : James J. Kubinec

It is certified that error appears in the above-identified patent and that said Letters Patent is hereby corrected as shown below:

Col. 4, line 2, "1166 t" should read --11$\Delta$t--.

Col. 8, line 41 - Claim 7, "[(N+1)fM+1)-1]" should read --[(N+1)(M+1)-1]--.

Signed and Sealed this

Seventeenth Day of December, 1991

Attest:

HARRY F. MANBECK, JR.

*Attesting Officer*   *Commissioner of Patents and Trademarks*